United States Patent
Cho

[19]

[11] Patent Number: 5,812,941
[45] Date of Patent: Sep. 22, 1998

[54] CIRCUIT FOR MEASURING OUTPUT POWERS OF CHANNELS AND STABILIZING RADIOFREQUENCY OUTPUT IN SYSTEM USING LINEAR POWER AMPLIFIER

[75] Inventor: Hyung Sik Cho, Kyoungki-do, Rep. of Korea

[73] Assignee: Hyundai Electronics Industries Co., Ltd., Rep. of Korea

[21] Appl. No.: 764,610

[22] Filed: Dec. 5, 1996

[30] Foreign Application Priority Data

Dec. 27, 1995 [KR] Rep. of Korea .................. 1995-58475

[51] Int. Cl.$^6$ ...................................................... H04B 1/04
[52] U.S. Cl. ........................ 455/126; 455/119; 455/115; 455/423
[58] Field of Search ...................... 455/126, 115, 455/116, 127, 119, 75, 26, 102, 103, 423; 330/129, 124 R

[56] References Cited

U.S. PATENT DOCUMENTS

| 4,517,526 | 5/1985 | Di Cicco | 330/284 |
| 5,507,015 | 4/1996 | Karczewski et al. | 455/116 |
| 5,530,920 | 6/1996 | Takeda | 455/62 |

*Primary Examiner*—Edward F. Urban
*Assistant Examiner*—Lee Nguyen
*Attorney, Agent, or Firm*—Fish & Richardson P.C.

[57] ABSTRACT

A circuit for measuring output powers of channels and stabilizing RF output in a system using a linear power amplifier, includes a channel portion in which each of channels is made up with an RF control board and frequency increasing board; a base station output portion for combining and outputting the respective channel signals via an antenna; and an output stabilizing portion for mixing the RF output signal of the base station output portion with a selected second local signal among the second local signals by the frequency increasing boards to make a low intermediate frequency, filtering it, and converting it into a direct current, and comparing the current with the output of a base station so as to control a selection channel frequency of channel portion and stabilize the output, whereby the variation of output power possibly occurring by an RF stage and the output power of the base station are stabilized.

3 Claims, 2 Drawing Sheets

CIRCUIT FOR MEASURING OUTPUT POWERS OF CHANNELS AND STABILIZING RADIOFREQUENCY OUTPUT IN SYSTEM USING LINEAR POWER AMPLIFIER

BACKGROUND OF THE INVENTION

1. Field of the Invention

The present invention relates to a circuit for measuring the output powers of channels and stabilizing RF (high frequency) output in a system using a linear power amplifier. This invention relates particularly to a circuit for measuring the outputs of channels and also for stabilizing the output variation caused at the RF stage by reducing several paths into one, in a system using a linear power amplifier.

2. Discussion of Related Art

Generally speaking, in the system using linear power amplifier, signals are combined at the front stage of the amplifier so that it is very hard to measure the output powers of channels at the final output. In case that part of power of adjacent channel is included in the power of another channel to be measured, it is also hard to accurately measure the output power by channels. In addition, because the power of the adjacent channel is not constant but always varies, it is more hard to measure the power of only the channel measured.

In case of a base station where n+1 channels exist, n+1 measurement paths are necessary, and n+1 voltage controlled oscillators (VCO) and phase locked loops (PLL) are necessary in turn, increasing cost. Besides this, the RF output power may be varied due to heat or the characteristics of the RF devices.

SUMMARY OF THE INVENTION

Accordingly, the present invention is directed to a circuit for measuring the output powers of channels and stabilizing RF output in a system using a linear power amplifier that substantially obviates one or more of the problems due to limitations and disadvantages of the related art.

This invention can accurately measure the power of a desired channel by removing the power of an adjacent channel with a bandpass filter. The measured value is converted into a direct current by a sensor, which is compared with the originally stored value. The loop is executed until they have no difference, to thereby stabilize an RF output. In addition, by reducing n+1 measurement paths into one, the cost is reduced. Using the second local signal of the frequency increasing board, no VCO and PLL IC are required. With one path, the difference between the paths can be reduced. Even with the redundancy caused due to the trouble of the RF control board and frequency increasing board, the circuit of the present invention operates smoothly. Even in case of the trouble of the linear power amplifier, its compensation is enabled. Without additional control board, all kinds of control can be made possible.

The present invention is made to add functions to the conventional directional coupler and RFIA. Using a mixer, n+1:1 switch, bandpass filter, sensing circuit and EEPROM, the output power of channels is measured accurately, and the RF output power is compensated for, to thereby ensure more stable and accurate RF output. This invention can be applied to any system using the linear power amplifier, and is more effective for broadband channel communications.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, there is provided a circuit for measuring output powers of channels and stabilizing RF output in a system using a linear power amplifier, includes a channel portion in which each of channels is made up with an RF control board and frequency increasing board; a base station output portion for combining and outputting the respective channel signals via an antenna; and an output stabilizing portion for mixing the RF output signal of the base station output portion with a selected second local signal among the second local signals by the frequency increasing boards to make a low intermediate frequency, filtering it, and converting it into a direct current, and comparing the current with the output of a base station so as to control a selection channel frequency of channel portion and stabilize the output, whereby the variation of output power possibly occurring by an RF stage and the output power of the base station are stabilized.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

DETAILED DESCRIPTION OF PREFERRED EMBODIMENT

Reference will now be made in detail to the preferred embodiments of the present invention, examples of which are illustrated in the accompanying drawings.

Figure 1:
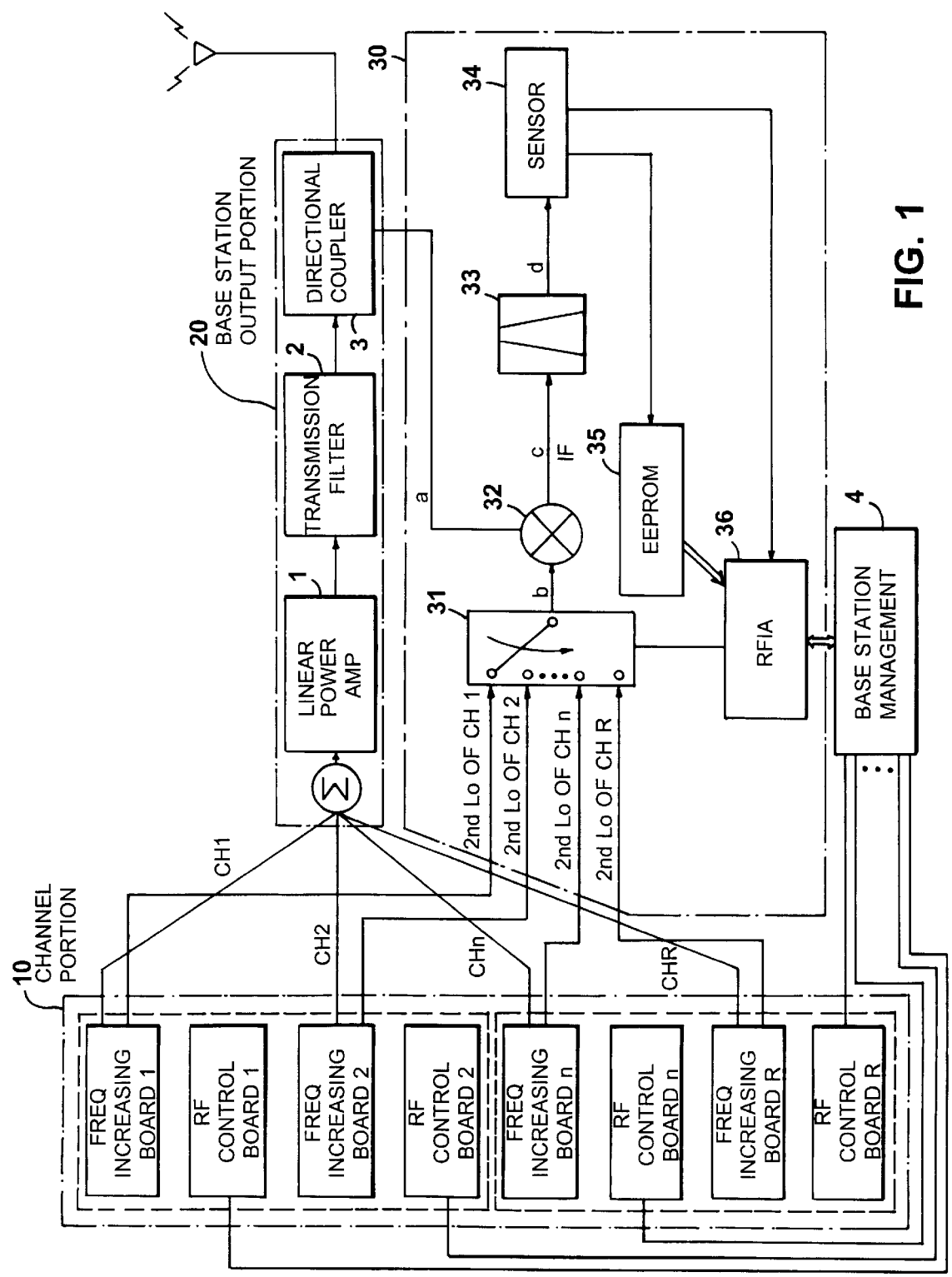
FIG. 1 is a block diagram of the circuit of the present invention.
Figure 2A:
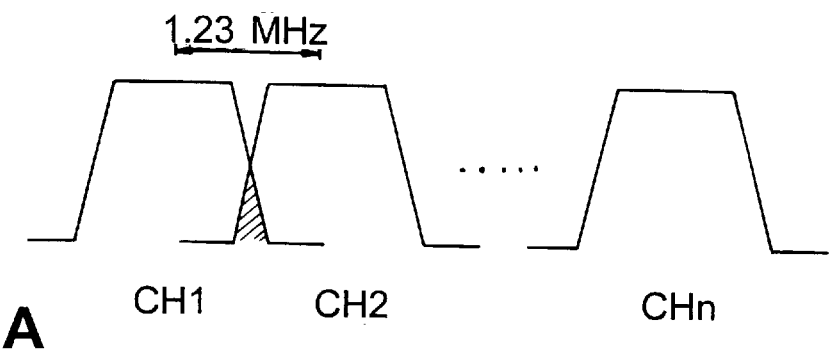
FIGS. 2A–2D are waveform diagrams of the respective portions of the present invention.
Figure 2B:
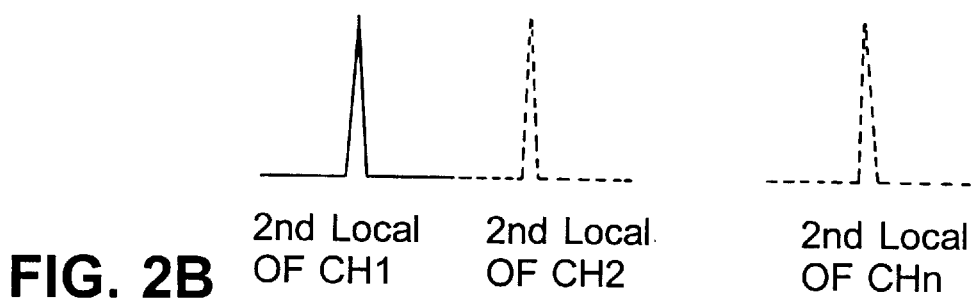
Figure 2C:
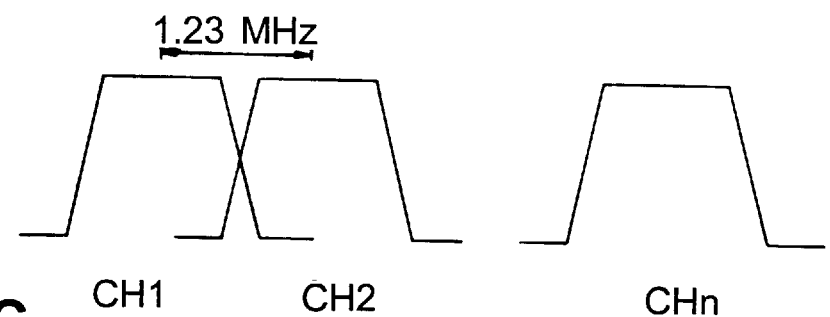
Figure 2D:
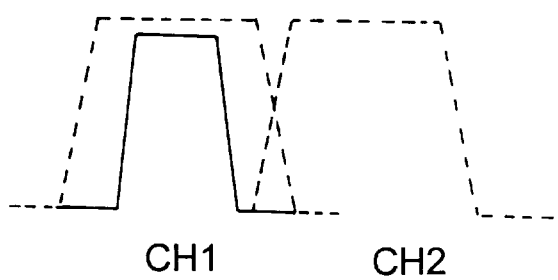

Referring to FIG. 1, one embodiment of the present invention comprises a channel portion 10 in which each of channels is made up with an RF control board and frequency increasing board, a base station output portion 20 for combining and outputting the respective channel signals via an antenna, and an output stabilizing portion 30 for measuring the output signals of the channels of channel portion 10 and thereby stabilizing the output variation caused at the RF stage.

Channel portion 10 is made in such a manner that each of the RF control board receiving information from the radiofrequency interface assembly 36 (RFIA) of output stabilizer 30 controls each gain of the frequency increasing boards to the RF control boards. In base station output portion 20, when each of the frequency increasing board output signal of channel portion 10 is mixed and goes into linear power amplifier 1, the output signal mixed in linear power amplifier 1 is filtered in transmission filter 2, and then a RF signal combined in directional coupler 3 is output to the antenna.

Output stabilizer 30 comprises a n+1:1 switch 31 for switching each second local signal from the corresponding frequency increasing boards of the channel portion 10 and outputting one local signal (b), a mixer 32 for mixing the local signal switched and the RF signal (a) from directional coupler 3 of output portion 20, and then outputting an intermediate frequency signal as a lowered signal, a bandpass filter 33 for filtering only a desired band of the intermediate frequency signal output from mixer 32, a sensor 34 for converting the output of bandpass filter 33 into a direct current, an EEPROM 35 connected to sensor 34 for offering the direct current value with respect to the overall power stored, to the RFIA 36, and the RFIA 36 for comparing the measured value of sensor 34 with the stored value of EEPROM 35, and sending the difference therebetween to each of the RF control board.

Output stabilizer 30 will be described below in connection with channel portion 10 and base station output portion 20 with reference to the output waveforms of FIG. 2.

Each of the second local signal of the n+1 frequency increasing boards (including redundancy R) is input to n+1:1 switch 31, which is periodically controlled by RFIA 36. This control is performed so that each gain of the frequency increasing boards is controlled by the corresponding RF control boards, the mixed and the filtered output of the linear power amplifier and the selected second local signal is measured, its error is compensated for, the output is re-measured, and if the measured value is identical with the stored value of EEPROM 35, switching is carried out to the next switch node.

This switched signal (b) (shown in FIG. 2B) is applied to the local port of mixer 32, and the RF signal (FIG. 2A) from directional coupler 3 of base station output portion 20 is applied to the RF port of mixer 32.

The intermediate frequency signal (c) (FIG. 2C) coming out of mixer 32 is frequency-lowered by the connected local signal and the RF signal so that there are one channel corresponding to the central frequency of bandpass filter 33 and n−1 channels. In the intermediate frequency signal (d) passing the bandpass filter, only part of the overall power, the channel to be measured, is filtered (the overall power does not need to be measured because only the direct current for the relative power to the overall power may be stored). For this reason, the power of the adjacent channel is not measured because it is present outside the filter's band, even though the channel exists closest (1.23 MHz in CDMA), but only the power of a desired channel is output as in FIG. 2D. This signal (FIG. 2D) is detected by an RF shortkey diode in sensing circuit 34, and then converted into direct current, which is transmitted to RFIA 36.

RFIA 36 compares the value of EEPROM 35 stored in setup with the direct current of sensing circuit 34, and then sends its difference to the RF control board of the same channel as that controlled by n+1:1 switch 31. The RF control board of channel portion 10 which receives the direct current difference from RFIA 36 alters the pin diode direct current bias present in the frequency increasing board so that the gain of the frequency increasing board is controlled by the difference. According to the gain controlled, the output varied is re-measured in order to confirm whether the stored value of EEPROM 35 is identical with the measured value or not. If so, switching is performed to the next node so that the next channel is measured. If the values are not the same, the loop is re-executed until they become identical. Here, RFIA 36 of output stabilizer 30 reads the stored value of EEPROM 35 so that the output power is known only with the direct current value. For this, prior to the mounting of output stabilizer 30, a signal generator is used in linear power amplifier 1 to give a local signal so that the output power versus direct current voltage are matched with respect to the direct current of sensing circuit 34 and the output power of directional coupler 3 and then stored in EEPROM 35.

In case that there occurs trouble in the frequency increasing board or RF control board and it is replaced with redundancy, this situation is recognized by RFIA 36 which then controls to switch to the channel (R) node of n+1:1 switch 1. This provides a path to the redundancy. If the linear power amplifier 1 is replaced with its redundancy, its gain varies slightly. In this case, gain variation occurs by the respective channels. This problem is overcome by executing the loop in order to stabilize the output. From now on, the control sequence of the operation of the present invention will be described more clearly.

First of all, base station management 4 transmits information on transmission output to RFIA 36, and RFIA 36 sends it to the RF control board in order to control the gain of the frequency increasing board. The RF signal combined by directional coupler 3 while the output of the frequency increasing board enters the linear power amplifier 1 and is then transmitted via the antenna is input to the RF port of mixer 32, and local signals come out of the n frequency increasing boards, are switched by n+1:1 switch 31, and input to the local port of mixer 32. Here, in the intermediate frequency signal coming out of mixer 32, only a desired channel is filtered by bandpass filter 33, converted into a direct current by sensing circuit 34, and sent to RFIA 36. RFIA 36 calculates the difference between the stored value of EEPROM 35, that is, the direct current corresponding to the output information transmitted from base station management 4, and the direct current measured. The calculated result is transmitted to the RF control board, and the gain of the frequency increasing board is varied by the difference. Then, the power of the channel is re-measured, and if there is still present the difference, the loop is executed until the difference disappears. If there is no difference, switching is performed to the next channel.

As described above, the present invention is capable of accurately transmitting an RF transmission power wanted by base station management 4, and also minimizing the variation of the output power occurring at the RF stage.

It will be apparent to those skilled in the art that various modifications and variations can be made in a circuit for measuring the output power of channels and stabilizing RF output in a system using a linear power amplifier of the present invention without departing from the spirit or scope of the invention. Thus, it is intended that the present invention cover the modifications and variations of this invention provided they come within the scope of the appended claims and their equivalents.

What is claimed is:

1. A circuit for measuring output powers of channels and stabilizing an RF output signal in a system using a linear power amplifier, said circuit comprising:

a channel portion in which each channel comprises an RF control board and a frequency increasing board that produces a channel signal and a second local signal;

a base station output portion for combining the respective channel signals and outputting the RF output signal; and an output stabilizing portion for mixing the RF output signal of said base station output portion with a selected second local signal selected from the second local signals of the channel portion to make a low intermediate frequency signal, filtering the low intermediate frequency signal, converting the filtered low intermediate frequency signal into a direct current, and comparing the direct current with a direct current derived from output of the base station so as to control a selected channel of the channel portion and stabilize the RF output signal.

2. The circuit as claimed in claim 1, wherein said base station includes a directional coupler and said output stabilizer portion comprises:

a switch for outputting a second local signal corresponding to one of the frequency increasing boards of said channel portion;

a mixer for mixing the RF output signal from said directional coupler of said base station output portion with the second local signal output from said switch;

a bandpass filter for receiving output of said mixer and removing the power effect caused by an adjacent channel to thereby accurately measure the power of a selected channel;

a sensor for sensing and converting output of said bandpass filter into a direct current;

an EEPROM connected to said sensor for storing a direct current value with respect to overall power; and a radiofrequency intermediate assembly for comparing output from said sensor with the stored value of said EEPROM, and sending the difference therebetween to a channel's RF control board to thereby control the channel's frequency increasing board.

3. The circuit as claimed in claim 2, wherein said switch is an n+1:1 switch that selects a second local signal from n+1 second local signals.

* * * * *